United States Patent
Kuroda et al.

(10) Patent No.: US 9,156,101 B2
(45) Date of Patent: Oct. 13, 2015

(54) SOLDERING APPARATUS AND MANUFACTURING METHOD OF SOLDERED PRODUCT

(71) Applicant: ORIGIN ELECTRIC COMPANY, LIMITED, Toshima-ku, Tokyo (JP)

(72) Inventors: Masami Kuroda, Tokyo (JP); Jun Matsuda, Tokyo (JP); Takayuki Suzuki, Tokyo (JP)

(73) Assignee: Origin Electric Company, Limited, Toshima-Ku, Tokyo (JP)

( * ) Notice: Subject to any disclaimer, the term of this patent is extended or adjusted under 35 U.S.C. 154(b) by 0 days.

(21) Appl. No.: 14/396,030

(22) PCT Filed: Apr. 24, 2013

(86) PCT No.: PCT/JP2013/062063
§ 371 (c)(1),
(2) Date: Oct. 21, 2014

(87) PCT Pub. No.: WO2013/161875
PCT Pub. Date: Oct. 31, 2013

(65) Prior Publication Data
US 2015/0090768 A1  Apr. 2, 2015

(30) Foreign Application Priority Data

Apr. 25, 2012  (JP) ................. 2012-099967

(51) Int. Cl.
| | | |
|---|---|---|
| *B23K 28/00* | (2006.01) | |
| *B23K 1/00* | (2006.01) | |
| *B23K 1/005* | (2006.01) | |
| *B23K 3/08* | (2006.01) | |
| *B23K 1/008* | (2006.01) | |
| *B23K 3/047* | (2006.01) | |
| *H05K 3/34* | (2006.01) | |
| *B23K 3/04* | (2006.01) | |

(52) U.S. Cl.
CPC ................. *B23K 3/085* (2013.01); *B23K 1/005* (2013.01); *B23K 1/008* (2013.01); *B23K 1/0016* (2013.01); *B23K 3/04* (2013.01); *B23K 3/047* (2013.01); *H05K 3/3494* (2013.01); *B23K 2201/42* (2013.01); *H05K 2203/1121* (2013.01); *H05K 2203/167* (2013.01)

(58) Field of Classification Search
CPC .. B23K 2201/40; B23K 1/0056; B23K 1/008; B23K 20/023; B23K 2203/10; B23K 1/0016; B23K 26/0626; B23K 3/03; B23K 3/0623
See application file for complete search history.

(56) References Cited

U.S. PATENT DOCUMENTS

| | | | | |
|---|---|---|---|---|
| 5,984,165 | A  * | 11/1999 | Inoue et al. .............. | 228/180.22 |
| 2005/0098610 | A1 * | 5/2005 | Onobori et al. .......... | 228/180.21 |
| 2006/0118598 | A1 * | 6/2006 | Chikamori et al. ............ | 228/42 |

FOREIGN PATENT DOCUMENTS

| | | |
|---|---|---|
| GB | 126103 | 6/1971 |
| JP | 63-165069 | 7/1988 |
| JP | 06-170528 | 6/1994 |
| JP | 3409679 | 5/2003 |

* cited by examiner

*Primary Examiner* — Erin Saad
(74) *Attorney, Agent, or Firm* — Squire Patton Boggs (US) LLP

(57) ABSTRACT

An excellent soldering apparatus and manufacturing method of soldered product are provided where a workpiece can be efficiently soldered in a short cycle time. The soldering apparatus includes a thermal radiation heater and two coolers for cooling the workpiece which sandwich the heater therebetween. The coolers are movable between a standby position and a cooling position and form a recessed portion in which the heater is placed. The coolers move to the standby position where the coolers are separated from the workpiece and stand by such that the heater is in a state of protruding from the recessed portion while the heater heats the workpiece. The coolers can move from the standby position to the cooling position to cool the workpiece.

8 Claims, 7 Drawing Sheets

SOLDERING APPARATUS AND MANUFACTURING METHOD OF SOLDERED PRODUCT

TECHNICAL FIELD

The present invention relates to a soldering apparatus and a manufacturing method of a soldered product, and more specifically, relates to a soldering apparatus for soldering a workpiece (electronic component, solder joint portion, and substrate) by heating and cooling the workpiece, and a manufacturing method of a soldered product.

BACKGROUND ART

Soldering (a heat treatment of a solder joint portion) is roughly classified into heating (process) and cooling (process). In the related art, as a soldering apparatus and a soldering method, a soldering apparatus and a soldering method in which a heating plate with a built-in thermal conduction heater for heating a workpiece is in contact with a lower entire surface of the workpiece and heats the workpiece, and a cooling stand formed to be contactable and separable with respect to a lower entire surface of the heating plate cools the workpiece through the heating plate have been known (for example, refer to PTL 1).

PRIOR ART DOCUMENT

Patent Document

[PTL 1] Japanese Patent No. 3409679 (for example, refer to FIG. 1)

DISCLOSURE OF INVENTION

Problem to be Solved by the Invention

However, in the soldering apparatus and the soldering method (refer to FIG. 1 of PTL 1) of the related art, the thermal conduction heater for heating the workpiece is formed to heat the workpiece through the heating plate having a large thermal capacity. Similarly, the cooling stand for cooling the workpiece is formed to cool the workpiece through the heated heating plate having a large thermal capacity. Therefore, in the soldering apparatus and the soldering method of the related art, a time for heating and cooling the heating plate having a large thermal capacity is required whenever the soldering is performed. The time for heating and cooling the heating plate increases a time required for soldering the workpiece (a cycle time). In the soldering apparatus and the soldering method, there is a demand for realizing soldering with a short cycle time.

The present invention has been made in view of the problems described above, and is to provide an excellent soldering apparatus and a manufacturing method of a soldered product which enable a workpiece to be efficiently soldered in a short cycle time.

Means for Solving the problem

To solve the above problem, a soldering apparatus 100 according to Aspect 1 of the invention is, as shown in FIG. 1A, 1B and FIG. 2A, 2B, for example, comprises: a thermal radiation heater 10 configured to heat a workpiece to be soldered by thermal radiation; and two coolers configured to cool the workpiece 1 soldered, the coolers 20a being arranged to sandwich the thermal radiation heater 10 therebetween, movable between a standby position and a cooling position, and formed with a recessed portion 21, the recessed portion 21 configured to dispose therein the thermal radiation heater 10 sandwiched between the two coolers 20a; wherein the coolers 20a are configured to be moved to the standby position where the coolers 20a are separated from the workpiece 1 and stand by such that the thermal radiation heater 10 is in a state of protruding from the recessed portion 21 while the thermal radiation heater 10 heats the workpiece 1, and the coolers 20a are configured to be moved from the standby position to the cooling position to cool the workpiece 1.

According to such a configuration, a heating plate with a large thermal capacity may not be needed, unlike in the soldering apparatus of the related art (for example, refer to FIG. 1 of PTL 1) provided with the heating plate. Therefore, the workpiece can be efficiently heated, and thus it is possible to more quickly heat the solder joint portion. In addition, it is possible to efficiently cool a heated portion (the solder joint portion) of the workpiece which is heated by the thermal radiation heater by the coolers which are arranged to sandwich the thermal radiation heater therebetween. "The coolers are arranged to sandwich the thermal radiation heater therebetween" indicates that the coolers are arranged to face each other on at least two outer positions having the thermal radiation heater as a center, and includes a case in which the thermal radiation heater is surrounded by the cooler. Therefore, it is possible to provide an excellent soldering apparatus in which a time required for soldering (a cycle time) is short. The heating of the workpiece can be performed in a heating state where the thermal radiation heater protrudes from the recessed portion of the cooler. In addition, the cooling of the workpiece by the cooler can be performed in a cooling state where the thermal radiation heater is embedded in (placed into) the recessed portion of the cooler. By embedding the thermal radiation heater in the recessed portion of the cooler, it is possible to suppress an influence due to residual heat from the thermal radiation heater to the workpiece and to increase cooling efficiency. Therefore, the control device provided in the soldering apparatus moves the cooler to the standby position, or to the cooling position, and thus it is possible to control the cooling of the workpiece. The control for heating of the workpiece and the cooling of the workpiece by the cooler can be performed by combining the heating state with the cooling state.

A soldering apparatus according to Aspect 2 of the invention is the soldering apparatus according to Aspect 1, as shown in FIG. 3A, for example, which further comprises: thermal blocking means 12, 22 for blocking radiation heat from the thermal radiation heater 10, the thermal blocking means being formed between the thermal radiation heater 10 and the coolers 20a.

According to such a configuration, it is possible to block the thermal radiation from the thermal radiation heater to the cooler, and thus it is possible to more adjacently dispose the thermal radiation heater and the cooler each other. Therefore, it is possible to provide an excellent soldering apparatus for efficiently performing the heating and the cooling in which the cycle time is short.

A soldering apparatus according to Aspect 3 of the invention is the soldering apparatus according to Aspect 1 or 2, as shown in FIG. 1A and FIG. 2A, for example, which further comprises a plurality of thermal radiation heaters 10, each of the thermal radiation heaters being sandwiched between the two coolers. That is, it comprises a plurality of thermal radiation heaters 10, each of which is sandwiched by coolers 20a.

According to such a configuration, even when there are a plurality of workpieces to be soldered, when the workpiece to be soldered includes a plurality of solder joint portions, or when a width of the workpiece to be soldered is large, it is possible to respectively adjacently arrange a plurality of thermal radiation heaters and coolers with respect to the solder joint portion of the workpiece to be soldered, and thus it is possible to efficiently perform the heating and the cooling to solder the workpiece. Therefore, it is possible to provide an excellent soldering apparatus for efficiently performing the heating and the cooling in which the cycle time is short.

A soldering apparatus according to Aspect 4 of the invention is the soldering apparatus according to any one of Aspect 1 to Aspect 3, as shown in FIG. 2A, for example, which further comprises an airtight chamber 120 configured to airtightly surround the thermal radiation heater 10 and the coolers 20a.

According to such a configuration, it is possible to solder the workpiece in the airtight chamber, and thus oxygen which inhibits the soldering is exhausted from the airtight chamber by a vacuum pump, and/or the airtight chamber is purged with inert gas (for example, nitrogen or argon), or is purged with reducing gas (for example, hydrogen or formic acid). Therefore, it is possible to eliminate oxygen to solder the workpiece. Therefore, even when a flux which serves as a reducing agent is not mixed into solder used in the soldering apparatus provided with the airtight chamber, it is possible to suppress an influence of an oxide film formed on a solder surface by controlling an atmosphere of the soldering, and thus it is possible to perform the soldering with high reliability where the soldering is not inhibited by the oxide film (and the flux). In addition, when the soldering is performed by using the solder into which the flux is not mixed, it is possible to exclude a flux cleaning process after the soldering, and thus it is possible to shorten a cycle time of an entire electronic component mounting procedure.

A soldering apparatus according to Aspect 5 of the invention is the soldering apparatus according to any one of Aspect 1 to Aspect 4, as shown in FIG. 2B, for example, which further comprises a guide post 23 configured to guide a movement of the coolers 20a; a cooling base portion 20b, the coolers 20a being integrally connected thereto; and a refrigerant supply device 150 configured to supply a refrigerant to cool the cooler 20a, wherein a refrigerant flow path 25 is formed inside the cooling base portion 20b and the guide post 23, the refrigerant flow path 25 being for circulating the refrigerant in the cooling base portion 20b through the guide post 23 to cool the coolers 20a.

According to such a configuration, it is possible to circulate the refrigerant by the refrigerant supply device inside the cooling base portion to which the cooler is integrally connected and the guide post. Therefore, it is possible to cool the cooler which is moved between the standby position and the cooling position by the refrigerant. In addition, in a case where the soldering apparatus is provided with the airtight chamber, and the refrigerant supply device is arranged outside the airtight chamber, it is possible to efficiently cool the cooler by exhausting heat of the cooler outside the airtight chamber.

A soldering apparatus according to Aspect 6 of the invention is the soldering apparatus according to any one of Aspect 1 to Aspect 5, as shown in FIG. 2A, for example, which further comprises a radiation thermometer 40 configured to measure a radiation temperature of the workpiece 1; and a control device 50 configured to control a heating of the workpiece 1 by the thermal radiation heater 10 and a cooling of the workpiece by the coolers 20a based on the radiation temperature of the workpiece 1 measured by the radiation thermometer 40.

According to such a configuration, it is possible to perform the control for suitable heating/cooling of the workpiece by the control device based on the radiation temperature of the workpiece which is measured by the radiation thermometer, and thus a time required for extra heating/cooling of the workpiece is reduced. Therefore, it is possible to realize further shortening of the cycle time while maintaining high quality (reliability) of the soldering.

A soldering apparatus according to Aspect 7 of the invention is the soldering apparatus according to any one of Aspect 1 to Aspect 6, as shown in FIG. 6, for example, which further comprises a secondary cooling device 30 configured to further cool the workpiece 1 after a cooling by the coolers 20a.

According to such a configuration, an electronic component is fixed onto a substrate by performing the cooling (primary cooling) of the solder using the cooler at a temperature lower than or equal to a freezing (solidification) point of the solder, and then the workpiece is transported to the secondary cooling device, and thus it is possible to perform the cooling (secondary cooling) of the solder using the secondary cooling device up to an ordinary temperature (an atmospheric temperature). In the workpiece subjected to the primary cooling, the soldered electronic component is not shifted from the substrate by the transport. Thus, when the workpiece is cooled in two steps of the primary cooling and the secondary cooling, it is possible to further shorten the cycle time of the soldering (a critical path required for cooling the workpiece).

A manufacturing method of a soldered product according to Aspect 8 of the invention is a manufacturing method of a soldered product using the soldering apparatus according to any one of Aspect 1 to Aspect 7, as shown in FIG. 7, for example, which comprises a step STEP1 of loading a workpiece 1 to be soldered on the soldering apparatus; and a step STEP2 of soldering the workpiece 1 by using the soldering apparatus.

According to such a configuration, it is possible to efficiently manufacture a soldered product having high quality by using an excellent soldering apparatus by which the soldering is performed in a short cycle time.

Effect of the Invention

According to the soldering apparatus and the manufacturing method of a soldered product of the present invention, it is possible to provide an excellent soldering apparatus and a manufacturing method of a soldered product by which a workpiece is efficiently soldered in a short cycle time.

BEST MODE FOR CARRYING OUT THE INVENTION

This application is based on the Patent Application No. 2012-099967 filed on Apr. 25, 2012 in Japan, the contents of which are hereby incorporated in its entirety by reference into the present application, as part thereof.

The present invention will become more fully understood from the detailed description given hereinbelow. However, the detailed description and the specific embodiment are illustrated of desired embodiments of the present invention and are described only for the purpose of explanation. Various changes and modifications will be apparent to those ordinary skilled in the art based on the detailed description.

The applicant has no intention to give to public any disclosed embodiment. Among the disclosed changes and modifications, those which may not literally fall within the scope of the patent claims constitute, therefore, a part of the present invention in the sense of doctrine of equivalents.

Embodiments of the present invention will be described hereinafter in detail with reference to the drawings. In each drawing, like numerals and symbols will be used for identical or like elements, and duplicate descriptions will not be repeated.

Figure 1A:
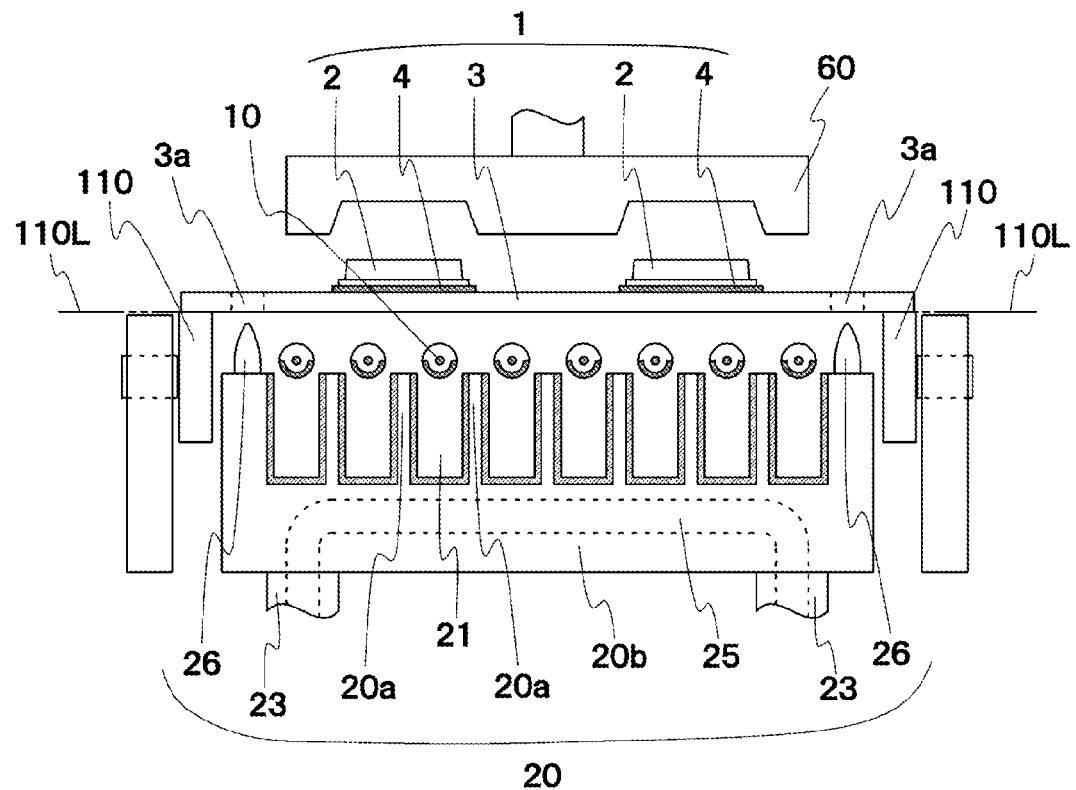
FIG. 1A is a drawing illustrating an example of a heating/cooling treatment unit of a soldering apparatus according to a first embodiment of the present invention at the time of performing heating.
Figure 1B:
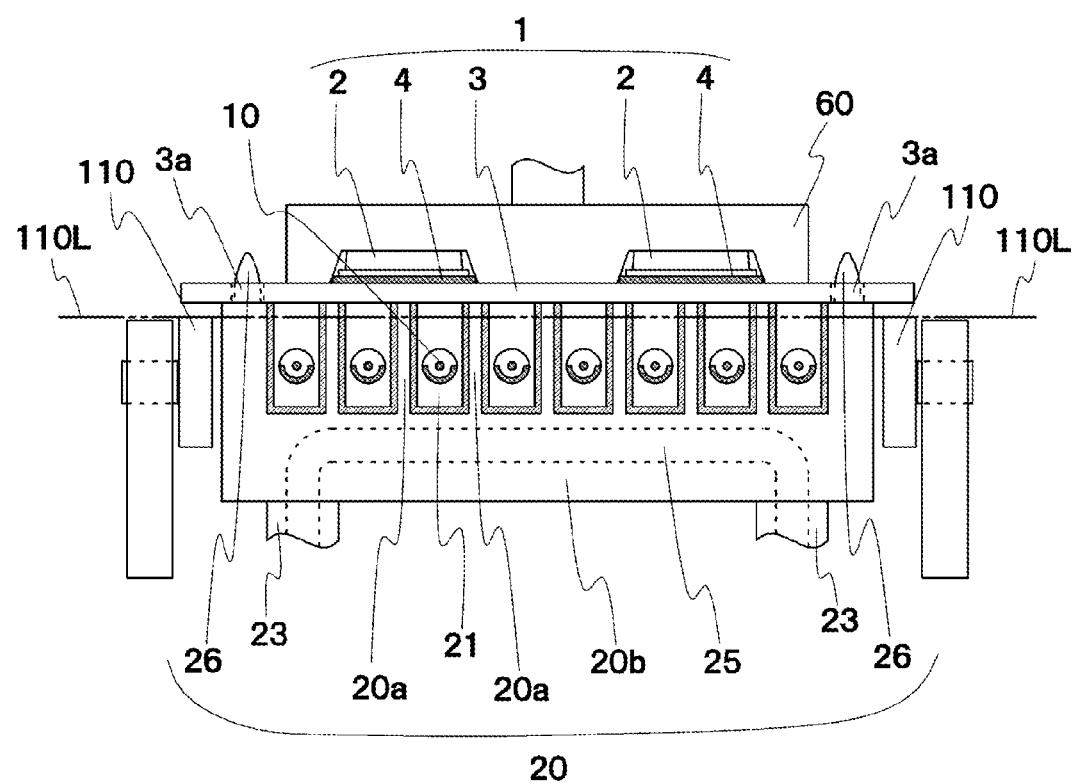
FIG. 1B is a drawing illustrating an example of a heating/cooling treatment unit of a soldering apparatus according to a first embodiment of the present invention at the time of performing cooling.

A heating/cooling treatment unit of a soldering apparatus 100 (refer to FIG. 2A) according to a first embodiment of the present invention will be described with reference to FIG. 1A, 1B. FIG. 1A, 1B are drawings in which the heating/cooling treatment unit of the soldering apparatus 100 is viewed from a transport direction of a transport line 110L of a workpiece 1 in the soldering apparatus 100. The transport line 110L is, here, directed from a deep side of the paper toward a front side of the paper.

The workpiece 1 is placed on a plurality of transport rollers 110 which are rotated, and is arranged to be transported on the transport line 110L up to an illustrated solder position (the heating/cooling treatment unit).

The soldering apparatus 100 (refer to FIG. 2A, 2B) is a heat treatment device (the heating/cooling device) for soldering the workpiece 1 by soldering an electronic component 2 and a substrate 3 through a solder joint portion 4. The electronic component 2 indicates a general electronic component such as a surface mounted chip resistor, and a chip capacitor in addition to a semiconductor package which is soldered to be fixed/connected to the substrate 3.

The soldering apparatus 100 (refer to FIG. 2A, 2B) includes a plurality of thermal radiation heaters 10 for heating the workpiece 1. A thermal radiation heater 10 is disposed to directly heat the entire workpiece 1 from a back surface (a lower surface) of the substrate 3 of the workpiece 1 for soldering. That is, the thermal radiation heater 10 is disposed such that a surface of the back surface (a heated surface) of the substrate 3 having a relatively larger thermal capacity than that of the electronic component 2 is directly heated, and thus a temperature of the heated surface of the substrate 3 increases, and a region from the substrate 3 to the electronic component 2 having a relatively smaller thermal capacity than that of the substrate 3 is heated by thermal conduction from the back surface as the heated surface of the substrate 3 through the solder joint portion 4. Therefore, the thermal radiation heater 10 cannot only efficiently heat the workpiece 1 in a short time, but also heat the entire workpiece 1 such that all of the substrate 3, the electronic component 2, and the solder joint portion 4 are sufficiently heated, and thus it is possible to realize the soldering with high reliability by securing preferable wetting and joint (conduction) of the solder joint portion 4 between the electronic component 2 and the substrate 3.

In the soldering apparatus of the related art (refer to FIG. 1 of PTL 1), when the heating plate is in contact with (abuts on) the workpiece in vacuum and the workpiece is heated by thermal conduction, the vacuum intervenes in an incomplete contact portion (a non-contact portion) between the workpiece and the heating plate due to thermal deformation of the workpiece (thermal warpage) or the like, and thus the heating of the workpiece (the thermal conduction between the workpiece and the heating plate) may be sometimes inhibited. In contrast, in the thermal radiation heater 10 of this embodiment, as described in detail later, even when the workpiece 1 is heated in vacuum in an airtight chamber 120 (refer to FIG. 2A, 2B), the heated surface as the heated portion of the workpiece 1 can be directly heated by the thermal radiation, and thus the heating of the workpiece 1 is not hindered by the intervention of the vacuum. In addition, as in this embodiment, when the heating is performed from the back surface of the substrate 3 of the workpiece 1 (in this embodiment, the lower surface) by the thermal radiation heater 10, the heating is not performed through the electronic component 2, and thus even when the electronic component 2 is an electronic component easily affected by heat, it is possible to perform the soldering without damaging the electronic component 2 by the heating.

Coolers 20a provided in the soldering apparatus 100 (refer to FIG. 2A, 2B) are formed as a plurality of copper cooling plates 20a for cooling the workpiece 1. The cooling plates are to be in contact with (abut onto) the soldered workpiece 1. The workpiece 1 is cooled through the thermal conduction. The cooling plate 20a is formed as a flat plate with a predetermined thickness, and is arranged such that a thickness direction thereof is in a horizontal direction. In other words, the normal lines of a surface and a back surface thereof respectively are directed in the horizontal direction. One end surface of the flat plate intersecting with the surface and the back surface is horizontally arranged to form an upper end surface of the cooling plate 20a. A lower end (surface) opposite to the upper end surface is integrally connected to a cooling base portion 20b. The upper end surface abuts on the workpiece 1, and the workpiece 1 is cooled by the thermal conduction. The predetermined thickness is suitably determined according to a size of the workpiece 1 to be soldered. In addition, in order to suitably arrange the cooling plate 20a between the thermal radiation heaters 10 to be used, the predetermined thickness, for example, is set to be 0.2 times to 0.6 times of an arrangement interval of a plurality of arranged thermal radiation heaters 10. Preferably, it is set to be 0.3 times to 0.5 times of the arrangement interval.

The upper end surface of the cooling plate 20a is arranged such that the cooling plate 20a is separated from the workpiece 1 and is driven to a separated position (a standby position) for waiting for the cooling duty while the workpiece 1 is heated by the thermal radiation heater 10 at the time of performing the heating illustrated in FIG. 1A. On the other hand, at the time of performing the cooling illustrated in FIG. 1B, the cooling plate 20a is arranged such that the cooling plate 20a is driven to a cooling position in which the cooling plate 20a is in contact with the workpiece 1. The cooling plate 20a is guided by a guide post 23 as a guide device, and is driven by an air cylinder 24 (refer to FIG. 2B) as a driving device and to be reciprocated (moved) between the separated position and the cooling position.

As illustrated in FIG. 1B, the cooling plate 20a is arranged to cool the workpiece 1 which is slightly lifted up (raised) from the transport line 110L. In such a case, the cooling plate 20a and the workpiece 1 are reliably brought into contact with each other, and it is possible to realize efficient cooling by the thermal conduction. In this embodiment, the plurality of cooling plates 20a are assembled in the cooling base portion 20b, and the plurality of cooling plates 20a and the cooling base portion 20b are formed to configure a major portion of the cooling device 20. The cooling plates 20a and the cooling base portion 20b to which the cooling plates 20a are assembled are preferably formed of a material with high thermal conductivity, for example, copper or a copper alloy. The cooling device 20 may be formed by inserting (fitting) the copper plate 20a as the cooling plate into a fitting groove (not illustrated) formed in the cooling base portion 20b, or may be integrally formed by machining the plurality of cooling plates 20a and the cooling base portion 20b from a lump of copper block using deep groove machining.

Figure 2A:
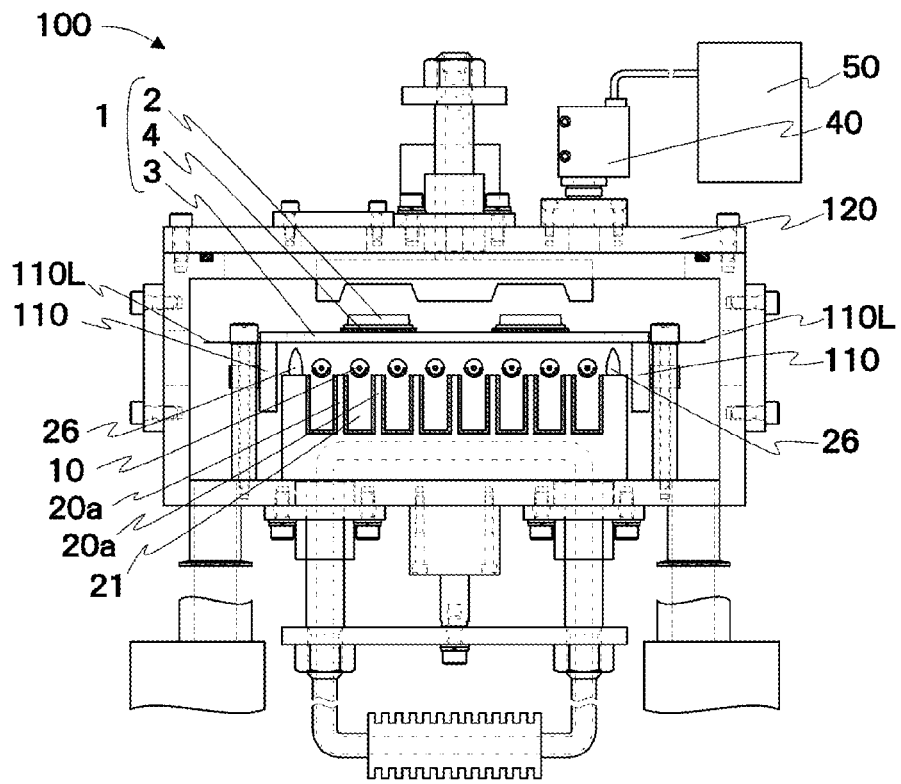
FIG. 2A is a drawing illustrating an example of the soldering apparatus according to the first embodiment of the present invention at the time of performing the heating.
Figure 2B:
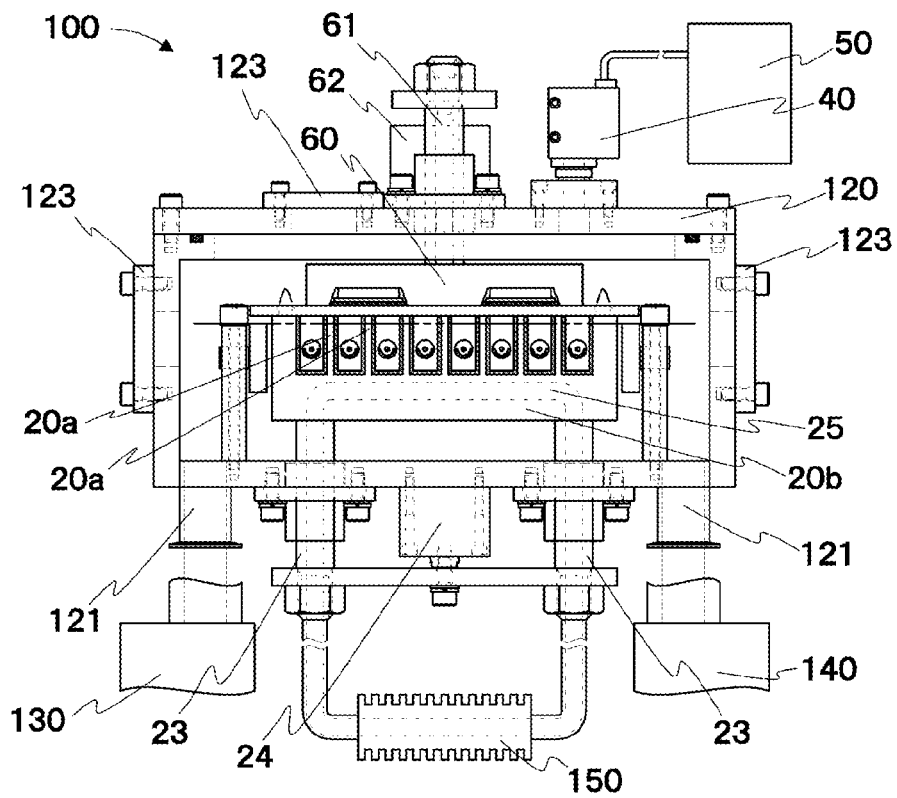
FIG. 2B is a drawing illustrating an example of the soldering apparatus according to the first embodiment of the present invention at the time of performing the cooling.

Inside the cooling base portion 20b (and the guide post 23), a refrigerant flow path 25 is formed, and the cooling is performed by circulating cooling water which is controlled such that it flows through the refrigerant flow path 25 at a constant flow rate by a refrigerant supply device 150 (refer to FIG. 2B). The refrigerant flow path 25 may be formed in the vicinity of a contact portion of the cooling plate 20a with the workpiece 1, and preferably may be formed up to the inside of the cooling plate 20a. When the cooling plate 20a is cooled by the cooling water flowing through the refrigerant flow path 25, cooling efficiency of the cooling plate 20a can be freely changed and controlled by changing a discharge quantity (a flow rate of the cooling water) of the refrigerant supply device 150, or by changing a temperature of the cooling water. Alternatively, the cooling efficiency may be changed and controlled by switching supply/stop of the cooling water. Furthermore, the refrigerant for cooling the cooling plate 20a can use any liquid or gas besides the cooling water.

The cooling plates 20a as the cooler are arranged to sandwich the thermal radiation heater 10 therebetween. The cooling plates 20a as the cooler which are arranged to sandwich the thermal radiation heater 10 therebetween will be described in detail later with reference to an enlarged drawing illustrated in FIG. 3A.

The cooling plate 20a is arranged on the same side as the thermal radiation heater 10 with respect to the workpiece 1, and in this embodiment, the cooling plate 20a is arranged on a lower side. It means that the cooling plate 20a is formed to be in contact with the heated surface of the workpiece 1 which is heated by the thermal radiation of the thermal radiation heater 10 and to perform the cooling. That is, the cooling plate 20a is disposed to perform the cooling of the workpiece 1 from the heated surface side of the workpiece 1 heated by the thermal radiation heater 10 (a heat transfer direction is opposite to a direction at the time of performing the heating). The heating (temperature rising) of the workpiece 1 by the thermal radiation heater 10 is, first, performed on the surface of the heated side of the workpiece 1. The surface faces the thermal radiation heater 10. And then, the thermal conduction (heat transfer) is gradually performed from the surface of the heated side of the workpiece 1 toward the inner portion of the workpiece 1, and thus the entire workpiece 1 is heated. The cooling plate 20a is formed to abut on (be in contact with) the workpiece 1 from the heated surface side of the workpiece 1 which is heated (temperature-raised) at the highest temperature by the thermal radiation heater 10, to absorb heat from the surface of the heated side of the workpiece 1, and to perform the cooling such that the heat transfer direction thereof is opposite to the heat transfer direction at the time of performing the heating. Thus it is possible to efficiently cool the workpiece 1. In this case, when the workpiece 1 is cooled by the cooling plate 20a, further thermal conduction and thermal diffusion toward the inner portion of the workpiece 1 do not occur in a heat transfer direction same as the direction at the time of performing the heating of the workpiece 1 by the thermal radiation heater 10. Therefore, the cooling plate 20a of this embodiment cools at high cooling efficiency the workpiece 1 which is heated by the thermal radiation heater 10, and thus it is possible to shorten the cycle time of the soldering.

In the soldering apparatus 100 (refer to FIG. 2A, 2B), the cooling of a large amount of heat through the heating plate with a large thermal capacity may not be performed, unlike in the soldering apparatus provided with the heating plate of the related art. In the soldering apparatus 100, it is possible to efficiently perform direct cooling of the workpiece 1 with a small thermal capacity compared to the heating plate of the related art. According to superiority in heating and cooling efficiency of such a soldering apparatus 100, it is possible not only to obtain an effect of shortening the cycle time of the soldering, but also to obtain an effect of realizing downsizing of the soldering apparatus 100.

In the soldering apparatus of the related art, the heating plate is disposed and the heating and the cooling of a large capacity are performed through the heating plate, and thus it is difficult to realize downsizing. On the other hand, generally, in the soldering apparatus, there is a demand for downsizing the soldering apparatus by which a plurality of soldering apparatuses can be disposed side by side in a limited floor area of a manufacturing plant in order to produce in a large volume, or in order to cope with a recent producing trend of many different kinds of small quantity. In the soldering apparatus 100 (refer to FIG. 2A, 2B) of this embodiment which can efficiently perform the heating and the cooling of the workpiece 1, the heating plate and the heating/cooling device of a large capacity which are used in the related art may not be provided, and thus it is possible to downsize the entire soldering apparatus. Thus, shortening the cycle time of the soldering apparatus by improving efficiency of heating and cooling of the workpiece and downsizing the soldering apparatus have a close relationship with each other.

The thermal radiation heater 10, and the cooling plates 20a as the coolers which are arranged to sandwich the thermal radiation heater 10 therebetween may appropriately be arranged to be positioned aligning the electronic component 2 (the solder joint portion 4) of the workpiece 1. Only a single thermal radiation heater 10 may be disposed corresponding to the solder joint portion 4, or a plurality of thermal radiation heaters 10 may be disposed. The illustrated heating/cooling treatment unit includes eight thermal radiation heaters 10 and nine cooling plates 20a. Furthermore, for example, one thermal radiation heater 10 and two cooling plates 20a sandwiching the thermal radiation heater 10 therebetween may be disposed as a set of heating/cooling unit, and the heating/cooling units may be arranged to be freely positioned in accordance with the arrangement of the solder joint portion 4 of the workpiece 1 to be soldered. Similarly, the workpiece 1 including a plurality of solder joint portions 4 may efficiently perform the soldering by positioning a plurality of heating/cooling units in accordance with the arrangement of the plurality of solder joint portions 4. The arrangement and the positioning of the heating/cooling unit(s) may be modified or adjusted for each predetermined production lot (a production quantity unit) of the same production type.

In each of the cooling plates 20a on both ends of the illustrated nine cooling plates 20a, a guide pin 26 for reliably and accurately bringing the cooling plate 20a to abut on a predetermined cooling region of the substrate 3 of the workpiece in the cooling position is formed. In such a case, the guide pin 26 can relatively position the cooling plate 20a and the workpiece 1 by being inserted into a positioning hole 3a formed in the substrate 3 when the cooling plate 20a is driven from the standby position to the cooling position, where the position of the substrate 3 is adjusted by the insertion. Therefore, the cooling plate 20a can abut on the predetermined cooling region of the workpiece 1, being accurately positioned corresponding to the solder joint portion 4 of the workpiece 1, and thus it is possible to efficiently perform the cooling of the workpiece 1.

Similarly, in a position facing the cooling plate 20a of the illustrated heating/cooling treatment unit, a guide block 60 for relatively positioning the workpiece 1 with respect to the cooling plate 20a being adjacent to or abutting onto the electronic component 2 and the substrate 3 is disposed. In this case, the workpiece 1 is accurately positioned with respect to the cooling plate 20a by the guide block 60, and thus it is possible to efficiently perform the cooling of the workpiece 1. Similar to the cooling plate 20a, the guide block 60 is guided by the guide post 61 (refer to FIG. 2B), and driven by an air cylinder 62 (refer to FIG. 2B). It is disposed to be abuttable on and separable from the workpiece 1. In addition, similar to the cooling base portion 20b and the guide post 23, inside the guide block 60 and the guide post 61, a refrigerant flow path (not illustrated) is formed, and cooling water is circulated through the refrigerant flow path. Therefore, the workpiece 1 can also be cooled by the guide block 60, and thus it is possible to more efficiently perform the cooling of the workpiece 1. That is, the guide block 60 may be used as an auxiliary cooler.

With reference to FIG. 2A, the soldering apparatus 100 of this embodiment will be further described. The soldering apparatus 100 includes an airtight chamber 120 which is provided in case the soldering is performed by using a solder in which a flux (reducing agent) is not added. The chamber 1220 is airtightly sealed containing the entire heating/cooling treatment unit (a heat treatment portion) including the heating heater 10 and the cooling plate 20a as the cooler which are blocked from outside air. In addition, in an inlet and an outlet of the transport line 110L for transferring the workpiece 1, gate valves 122 (refer to FIG. 6) which are reciprocated in a direction (a vertical direction) perpendicularly intersecting with the transport line 110L, and seals/breaks vacuum in the airtight chamber 120 are disposed.

With reference to FIG. 2B, driving of the soldering apparatus 100 will be described. The soldering apparatus 100 includes the air cylinder 24 which reciprocates the cooling plates 20a (and the cooling base portion 20b) between the cooling position and the standby position (the separated position), and the guide post 23 which guides driving of the cooling plates 20a by the air cylinder 24. In addition, the soldering apparatus 100 includes the air cylinder 62 which drives the guide block 60 described above to abut on and separated from the workpiece, and the guide post 61 which guides driving of the guide block 60 by the air cylinder 62. As well as in movable portions of the guide posts 23 and 61, and the air cylinders 24 and 62, in a movable portion of the gate valve 122 (refer to FIG. 6) described above, a sealing member (for example, an O-ring seal or the like) for airtightly sealing the airtight chamber 120 is provided to airtightly maintain the airtight chamber 120. In addition, in the soldering apparatus 100, a plurality of quartz glass viewing windows 123 are formed through which a manufacturer confirms a operating state of the apparatus and a state of the workpiece to be subjected to the heat treatment observing them from the outside of the airtight chamber 120. The viewing window 123 is also sealed such that the airtight chamber 120 is airtightly maintained.

The soldering apparatus 100 further includes a vacuum pump 130 connected to a supply and exhaust port 121. The vacuum pump 130 sucks gas inside the airtight chamber 120 such that a pressure thereof becomes lower than an atmospheric pressure (for example, approximately 50 to 1000 mTorr). In addition, the soldering apparatus 100 includes a gas supply pump 140 connected to the other supply and exhaust port 121 which supplies a reducing gas (for example, hydrogen, formic acid, or the like) into the airtight chamber 120 after the airtight chamber 120 is exhausted by the vacuum pump 130, and fills inside the airtight chamber 120 with the reducing gas. In such a case, oxygen (air) which exists in the airtight chamber 120 and forms an oxide film on the solder surface, and thus inhibits the soldering with high reliability, is exhausted by the vacuum pump 130, and the oxide film formed on the solder surface is reduced/ablated by the reducing gas supplied by the gas supply pump 140. Therefore, the soldering apparatus 100 can perform the soldering with high reliability by using the solder in which the flux as a reducing agent is not added. That is, the soldering apparatus 100 can be formed as a vacuum soldering unit.

Thus, when the soldering is performed by substituting an atmosphere in the airtight chamber 120 with an atmosphere of the reducing gas (for example, hydrogen, formic acid, or the like), it is possible to reduce and ablate the oxide film formed on the solder surface without using a solder in which the flux as the reducing agent is added, and it is possible to perform the soldering with high reliability without forming the oxide film. In addition, the solder in which the flux is not added can be used, and thus it is possible to make a flux cleaning procedure after performing the soldering unnecessary, and it is possible to perform excellent soldering without degrading reliability (quality) of the soldering due to existence of the flux. When a flux cleaning process (not illustrated) is not necessary after performing the soldering, it is possible to shorten a cycle time of an entire electronic component mounting procedure (not illustrated), and it is possible to downsize the entire electronic component mounting procedure.

The soldering apparatus 100 includes a radiation thermometer 40 for measuring a radiation temperature of the workpiece. The soldering apparatus 100 also includes a control device 50 which controls the heating of the workpiece by the thermal radiation heater 10 (refer to FIG. 2A) and the cooling of the workpiece by the cooling plates 20a based on a measured value of the radiation temperature of the workpiece by the radiation thermometer 40. In such a case, it is possible to perform the soldering by controlling the heating and the cooling of the workpiece based on an actually measured radiation temperature of the workpiece, and thus it is possible to further shorten the cycle time by inhibiting occurrence of a time for excessively heating and/or cooling the workpiece. In addition, it is possible to confirm that the workpiece is heated up and cooled down to a suitable temperature based on the actually measured radiation temperature, and thus it is possible to realize the soldering with high reliability and high quality. In this embodiment, the movement of the coolers 20a to the standby position, or the movement of the coolers 20a to the cooling position is performed by driving the air cylinder 24 (refer to FIG. 2B). The control device 50 turns the driving of the air cylinder 24 ON or OFF, or adjusts a movement amount of the coolers 20a driven by the air cylinder 24.

The soldering apparatus 100 can efficiently perform the heating and the cooling, and thus it is possible to perform the soldering with more excellent controllability compared to the soldering apparatus of the related art. For example, even when the workpiece is heated more quickly, in an optional temperature increasing pattern, the heating is controlled such that, for example, a temperature of the heated portion of the workpiece increases along a logarithmic curve in order to be in accordance with thermal deformation (thermal warpage) of the workpiece, or in order to suppress an influence of the thermal deformation of the workpiece on quality (reliability) of the soldering. In addition, in an optional temperature decreasing pattern, for example, the cooling may be controlled such that a temperature of a cooled portion of the workpiece decreases along a fractional function and is close to an ordinary temperature.

Figure 3A:
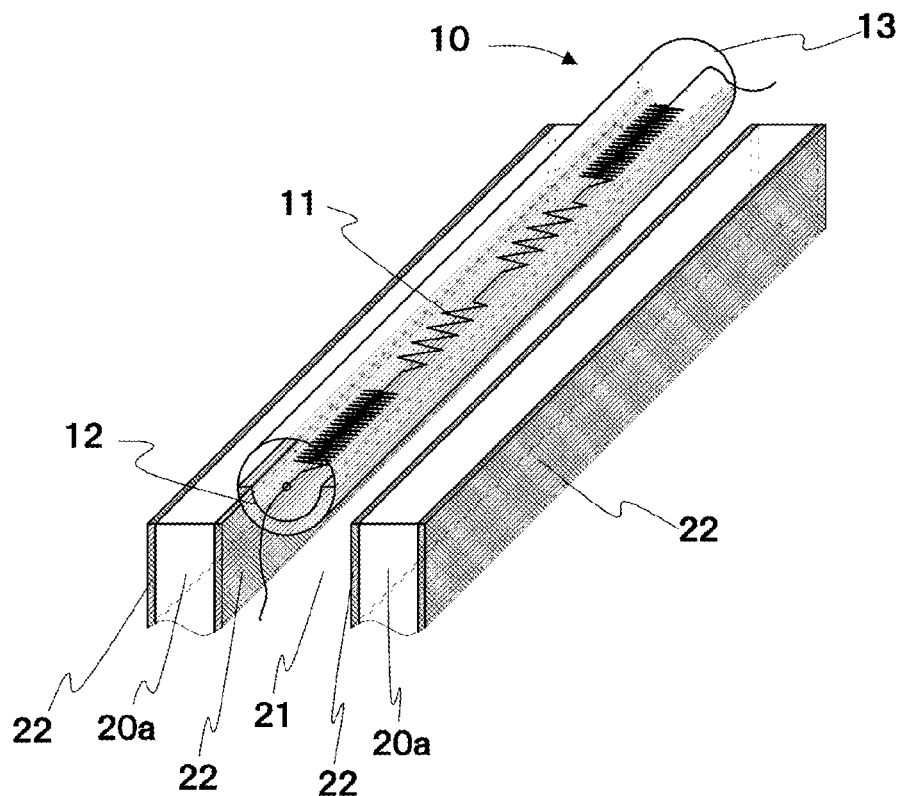
FIG. 3A is a drawing enlargedly illustrating an example of a thermal radiation heater and coolers provided in the soldering apparatus according to the first embodiment of the present invention, where the thermal radiation heater and the coolers are formed in a linear shape.

A specific example of the thermal radiation heater and the cooling plate will be further described in detail with reference to an enlarged drawing of FIG. 3A, 3B. The thermal radiation heater 10 of this embodiment illustrated in FIG. 3A is formed as a halogen heater. That is, the thermal radiation heater 10 is formed by covering a thermal radiation unit 11 formed of a tungsten thermal radiation filament with a thermal radiation unit sealing tube 13 formed of a quartz glass, and by encapsulating inert gas (for example, nitrogen, argon, or the like) and halogen gas (for example, iodine, bromine, or the like) in the thermal radiation unit sealing tube 13.

When the thermal radiation heater 10 is formed as the halogen heater, the thermal radiation heater 10 can endure rapid increase and decrease in temperature thanks to a halogen cycle between halogen and tungsten, and thus it is possible to set a temperature of a tungsten filament (the thermal radiation unit 11) to a high temperature exceeding 2700 degrees Celsius within several seconds after energizing. Therefore, the thermal radiation heater 10 can rapidly heat the facing workpiece by the thermal radiation from the thermal radiation unit 11 of the high temperature. Similarly, the thermal radiation heater 10 can sufficiently extend a life of the tungsten filament by the halogen cycle. Therefore, the workpiece can be rapidly heated, and an excellent thermal radiation heater 10 can be realized with high economic productivity.

The thermal radiation heater 10 formed as the halogen heater can directly heat the workpiece facing the thermal radiation heater 10 from a heating position of the thermal radiation heater 10 which is fixed to be separated from the workpiece by the thermal radiation (including infrared ray radiation of a wide wavelength region from a near-infrared ray wavelength region (approximately 0.75 µm to approximately 4 µm) to a far-infrared ray wavelength region (approximately 4 µm to approximately 1 mm)). The thermal radiation heater 10 heats the solder joint portion, for example, up to 220 degrees Celsius to 400 degrees Celsius, and thus it is possible to solder the workpiece by heating the solder joint portion to a temperature higher than or equal to a melting point of the solder. For example, when a solder containing a lot of a zinc component is used for the solder joint portion, it is possible to set a heating temperature of the solder joint portion to approximately 300 degrees Celsius.

The thermal radiation heater 10 is formed into a linear shape (a rod-like shape). A thermal radiation distribution (a thermal radiation quantity) from the thermal radiation heater 10 can be realized as a desired thermal radiation distribution, for example, by changing a coarse and fine distribution of the tungsten filament (the thermal radiation unit 11). In this embodiment, the number of turns of the filament is changed such that filament density is low (coarse) in a center portion of the thermal radiation heater 10 which is easily heated to a high temperature, and the filament density is high (fine) in both end portions. According to this configuration, the thermal radiation distribution (the thermal radiation quantity) from the thermal radiation heater 10 is changed according to a mass (a thermal capacity) and a surface area of the solder joint portion and required quality (for example, a level of reliability) of the solder, or the like, and thus it is possible, for example, to uniformly heat the entire workpiece. On the other hand, in contrast, the thermal radiation distribution (the thermal radiation quantity) from the thermal radiation heater 10 can be a thermal radiation distribution (a thermal radiation quantity) in which only the solder joint portion of any portion of the workpiece is intensively heated.

The thermal radiation heater 10 includes thermal blocking means 12. In this embodiment, the thermal blocking means 12 is formed as a mirror surface positioned in a portion of a side which does not face the workpiece to be soldered in an inner surface or an outer surface of the thermal radiation unit sealing tube 13 (a quartz glass tube) for surrounding the thermal radiation unit 11 (the tungsten filament) of the thermal radiation heater 10. The mirror surface 12 as the thermal blocking means can be formed by partially performing vacuum deposition (plating) to the quartz glass thermal radiation unit sealing tube 13 using chromium. The mirror surface may be formed of zirconium (plating) instead of chromium (plating). By forming the portion of the thermal radiation heater 10 as the mirror surface 12, where the portion does not face the workpiece to be soldered, it is possible to further increase the thermal radiation radiated toward the workpiece to be soldered. In this case, the workpiece can be more efficiently heated.

In this embodiment, the cooling plates 20a as a plurality of coolers (two in the drawing) are arranged to sandwich the thermal radiation heater 10 therebetween. That is, two cooling plates 20a are arranged in two positions in a radially outer direction of the thermal radiation heater 10 to face each other in parallel, where an outer circumference of the heater is formed of a quartz glass tube 13 of a cylindrical shape and the heater is disposed at the center of the arrangement. In addition, the thermal radiation heaters 10 and the cooling plates 20a are alternately arranged along the surface to be heated of the workpiece. In other words, each of the thermal radiation heaters 10 and the cooling plates 20a are arranged to face the workpiece without interfering with each other. Here, a case where the two cooling plates 20a are arranged to face each other in parallel is illustrated. Here, low parallelism is allowable insofar as the thermal radiation heaters 10 and the cooling plates 20a do not interfere with each other, and the cooling is performed efficiently. According to this arrangement, the heated portion of the workpiece which is heated by the thermal radiation heater 10 can be cooled by being sandwiched between a plurality of cooling regions (at a position sandwiched between the two cooling plates 20a). When the heated portion is cooled by being sandwiched, heat is carried from a center portion of the heated portion which is generally considered to have the highest temperature toward a peripheral portion, and the heat is distributed and carried into the plurality of cooling regions which are arranged to be separated into at least two facing directions (that is, the heat is distributed and diffused), and thus the cooling can be performed. Therefore, the workpiece can be efficiently cooled.

In addition, in this embodiment, the thermal radiation heater 10 is embedded in (placed into) a recessed portion 21 (of the cooling device 20 (refer to FIG. 1A, 1B)) formed between the two cooling plates 20a which are arranged to sandwich the thermal radiation heater 10 therebetween. As particularly illustrated in FIG. 1B, embedding indicates a state of the thermal radiation heater 10 when the cooling plates 20a are driven into the cooling position. In the heating state where the cooling plates 20a are at the standby position (the separated position) and the workpiece is heated by the thermal radiation heater 10 as illustrated in FIG. 1A, the thermal radiation heater 10 may be in a state of protruding from the recessed portion 21 to a certain extent. Protruding to a certain extent indicates a state where the thermal radiation heater 10 protrudes due to descending of the cooling plate 20a to the standby position. When the thermal radiation heaters 10 are disposed to be embedded in the recessed portion 21 formed by the plurality of cooling plates 20a, it is possible not only to place the cooling plate 20a in the vicinity of the portion to be heated of the workpiece, but also to preferably downsize the soldering apparatus by realizing space saving of the heating/cooling heat treatment portion. Thus, the coolers 20a can be moved independently of the thermal radiation heater 10.

The mirror surface 22 illustrated in FIG. 3A as the thermal blocking means of the cooling plate 20a is formed by performing nickel plating to an entire surface inside the recessed portion (a groove) 21 (of the cooling device 20 (refer to FIG. 1A, 1B)) formed by the plurality of cooling plates 20a. When the entire surface inside the recessed portion 21 is formed as a mirror surface, it is possible to reflect the thermal radiation of the thermal radiation heater 10 by double mirror surfaces 12 and 22 of the mirror surface 12 as the thermal blocking means which is formed in the thermal radiation unit sealing tube 13 (the quartz glass tube) of the thermal radiation heater 10 described above and the mirror surface 22 as the thermal blocking means which is formed on the surface inside the recessed portion 21. Therefore, it is possible to further improve efficiency of heat reflection by the mirror surfaces 12 and 22, and thus it is possible to more efficiently use the thermal radiation of the thermal radiation heater 10 for heating the workpiece.

Furthermore, a case where the mirror surfaces 12 and 22 as the thermal blocking means of this embodiment are formed in both the thermal radiation heater 10 and the cooling plate 20a is described, but in another embodiment, either the mirror surface 12 or the mirror surface 22 may not be formed. However, when the mirror surface 12 is formed in the thermal radiation heater 10, it is possible to more effectively prevent radiation heat from being diffused. When the mirror surface 22 is formed in the cooling plates 20a (in the recessed portion 21), it is possible to prevent cold heat radiation (absorption of the radiation heat), and thus it is possible to increase cooling efficiency. Further, in another embodiment, the mirror surface 22 may not be formed in the surface (for example, surfaces toward the outside of the cooling plates 20a on both of the ends of the nine cooling plates 20a illustrated in FIG. 2A, 2B (facing an inner surface of the airtight chamber 120)) of the cooling plate 20a which does not face the thermal radiation heater 10. However, when the mirror surface 22 is formed on the surface of the cooling plate 20a which does not face the thermal radiation heater 10, it is possible to prevent the cold heat radiation to the outside from the surface of the cooling plate 20a which does not face the thermal radiation heater 10. In addition, in this embodiment, the mirror surface is not formed on the upper end surface of the cooling plate 20a. In this apparatus, due to fine unevenness of the workpiece or the upper end surface, a slight gap causing the upper end surface which abuts on the workpiece at the time of performing the cooling of the workpiece not to be completely in contact with the workpiece may be formed, and thus heat transfer by the thermal conduction may not be sufficiently expected. Even in such a case, in a configuration where the mirror surface is not formed on the upper end surface of the cooling plate 20a, the heat transfer by the cold heat radiation is easily performed. Furthermore, the mirror surface may be formed on the upper end surface. In this case, when the workpiece is heated by the thermal radiation heater 10, it is possible to inhibit the absorption of the radiation heat through the upper end surface of the cooling plate 20a.

In addition, a case where the thermal blocking means 12 and 22 of this embodiment are formed as the mirror surface is described, but in another embodiment, the thermal blocking means 12 and 22 are not formed as the mirror surface, but a heat insulating material such as ceramic is more easily arranged, and thus heat insulation between the thermal radiation heater 10 and the cooling plate 20a may be realized. When the thermal blocking means 12 and 22 are formed of the heat insulating material, there is an advantage that the heat transfer is inhibited in a gaseous atmosphere not in vacuum. In this case, unlike in a case where the thermal blocking means 12 and 22 are formed as the mirror surface, the heat reflection by the mirror surface does not have to be radiated toward the workpiece by passing through an opening of the recessed portion (the groove) 21 (of the cooling device 20 (refer to FIG. 1A, 1B)) formed by the plurality of cooling plates 20a. That is, a gap (an opening) for radiating the thermal radiation reflected by passing through a space between the thermal blocking means 12 and the thermal blocking means 22 toward the workpiece may not be formed, and thus it is possible to closely or integrally form the thermal blocking means 12 and 22 formed of the heat insulating material. In this case, it is possible to more adjacently arrange the thermal radiation heater 10 and the cooling plates 20a by sandwiching the thermal blocking means 12 and 22 therebetween which are closely or integrally formed. Thus, when the thermal blocking means 12 and 22 are formed of the heat insulating material, it is possible to more adjacently arrange the cooling plates 20a on the heated portion of the workpiece, and it is possible to further downsize the heating/cooling heat treatment portion.

In addition, in this embodiment, a case where the thermal blocking means 22 is formed as the mirror surface by performing nickel plating to the inside of the groove of the recessed portion 21 (of the cooling device 20 (refer to FIG. 1A, 1B)) formed by the plurality of cooling plates 20a is described, and in another embodiment, the thermal blocking means 22 may be formed by forming the mirror surface (a finished mirror surface) by machining the inside of the groove of the recessed portion 21 (of the cooling device 20) using precision grinding.

In addition, a case where the thermal radiation heater 10 of this embodiment is formed as the halogen heater is described, but in another embodiment, the thermal radiation heater 10 may be formed as a carbon heater by encapsulating a carbon fiber filament in inert gas. In this case, it is possible to radiate enough infrared rays in a wavelength region with a wavelength of approximately 2 µm to approximately 4 µm which is close to a peak of an absorption spectrum of water (a wavelength of approximately 3 µm). Therefore, when the workpiece includes moisture (an electronic component and a substrate of a semiconductor package or the like generally have a certain moisture absorbency), the thermal radiation heater 10 formed as the carbon heater preferably heats the workpiece through the moisture included in the workpiece, and thus it is possible to efficiently heat the workpiece. In addition, in still another embodiment, the thermal radiation heater 10 may be formed as a nichrome wire heater by encapsulating a nichrome filament in the air. In this case, it is possible to more easily form the thermal radiation heater 10.

Figure 3B:
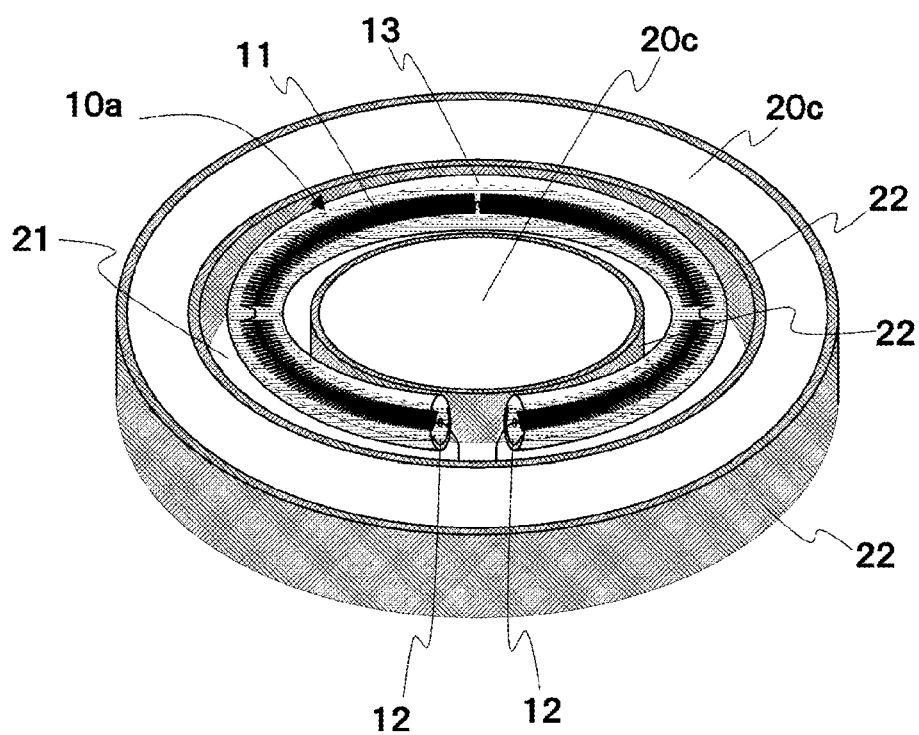
FIG. 3B is a drawing enlargedly illustrating an example of a thermal radiation heater and coolers provided in the soldering apparatus according to another embodiment of the present invention, where the thermal radiation heater is formed in a circular arc or annular shape and the coolers are formed in a columnar shape and in a cylindrical shape according to another embodiment of the present invention.

In addition, a case where the thermal radiation heater 10 of this embodiment is formed into a rod-like shape is described, but in another embodiment, for example, as illustrated in FIG. 3B, a thermal radiation heater 10a may be formed into a circular arc shape (a circumferential shape), and a cooling plate 20c may be formed into a columnar shape and a cylindrical shape. In this case, the thermal radiation heater 10a of the circular arc shape (or annular shape) can be sandwiched between the cooling plate 20c of the columnar shape and the cooling plate 20c of the cylindrical shape, and thus it is possible to efficiently cool the workpiece which is heated by the thermal radiation heater 10a of the circular arc shape by the cooling plates 20c of the columnar shape and the cylindrical shape. Thus, it is possible to form the thermal radiation heater and the cooling plate into any shape in accordance with a shape and an arrangement of the solder joint portion of the workpiece.

Figure 4A:
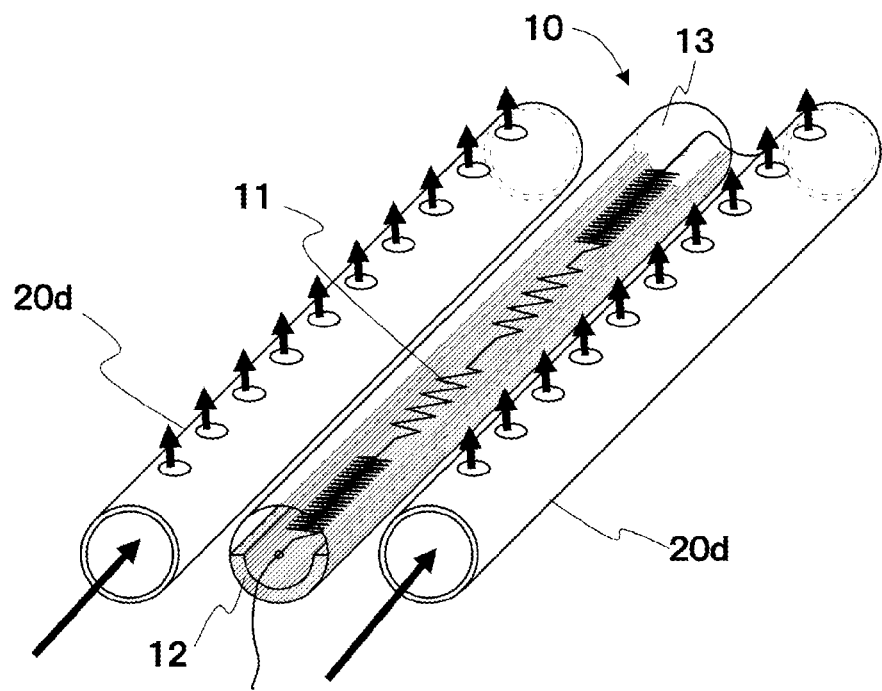
FIG. 4A is a drawing enlargedly illustrating an example of the thermal radiation heater and the coolers provided in the soldering apparatus according to still another embodiment of the present invention, where the thermal radiation heater is formed in a linear shape and cooling gas spray nozzles are formed in a linear shape as the coolers.

Other combinations of the thermal radiation heater and the cooler will be described with reference to FIG. 4A, 4B. In the embodiment described above, a case where the cooling is performed with respect to the workpiece by the thermal conduction using the cooling plate 20a as the cooler is described, but in another embodiment, for example, as illustrated in FIG. 4A, a cooling gas spray nozzle 20d for cooling the workpiece by spraying cooling gas onto the workpiece may be formed as the cooler. In this case, a plurality of (two in the drawing) cooling gas spray nozzles 20d can be arranged to sandwich the thermal radiation heater 10 therebetween, and thus it is possible to efficiently cool the workpiece by distributing the heat of the heated portion of the workpiece into a plurality of directions. The cooling gas is typically air, but inert gas (for example, nitrogen, argon, or the like) or reducing gas (for example, hydrogen, formic acid, or the like) may be used. This is especially easily used in an embodiment where the gas is supplied into the airtight chamber 120 (refer to FIG. 2A, 2B) and the soldering is performed.

Furthermore, in an embodiment where the soldering is performed in vacuum, the vacuum in the airtight chamber 120 (refer to FIG. 2A, 2B) is broken by opening a gate valve 122 (refer to FIG. 6), and then the cooling gas may start to be sprayed onto the workpiece from the cooling gas spray nozzle 20d. Alternatively, by spraying the cooling gas onto the workpiece from the cooling gas spray nozzle 20d, the vacuum in the airtight chamber 120 may be broken. When the vacuum in the airtight chamber 120 is broken by spraying the cooling gas onto the workpiece from the cooling gas spray nozzle 20d, a time required for breaking the vacuum in the airtight chamber 120 can be used for cooling the workpiece. In contrast, when the vacuum in the airtight chamber 120 is broken by opening the gate valve 122, and then the cooling gas is sprayed onto the workpiece from the cooling gas spray nozzle 20d and the cooling is performed in atmospheric air, it is possible to efficiently cool the workpiece by a mixture and a convective flow of the cooling gas and the atmospheric air, and by the thermal conduction and the thermal diffusion from the workpiece to other structural members of the soldering apparatus such as the airtight chamber 120 through the cooling gas and the atmospheric air.

Furthermore, in this embodiment, a case where the thermal radiation heater 10 is formed to be embedded in the recessed portion (the groove) 21 (of the cooling device 20 (refer to FIG. 1A, 1B)) formed by the plurality of cooling plates 20a is described, and in another embodiment, when the cooling gas spray nozzle 20d is formed as the cooler, the thermal radiation heater 10 may be similarly embedded in the recessed portion formed by the plurality of (two in the drawing) cooling gas spray nozzles 20d as illustrated.

Figure 4B:
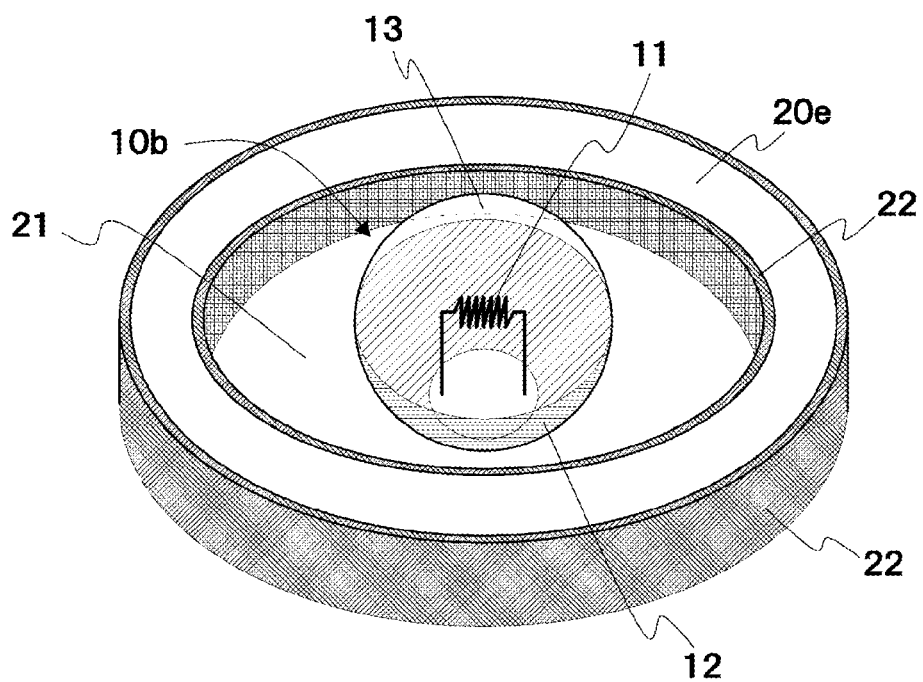
FIG. 4B is a drawing enlargedly illustrating an example of the thermal radiation heater and the coolers provided in the soldering apparatus according to still another embodiment of the present invention, where the thermal radiation heater is formed in a spherical shape and the coolers are formed in a cylindrical shape.

In addition, a case where the thermal radiation heater 10 of this embodiment is formed into a rod-like shape is described, and in another embodiment, for example, as illustrated in FIG. 4B, a thermal radiation heater 10b is formed as a halogen heater of a spherical shape, and an outer circumference of the thermal radiation heater 10b formed into a spherical shape is formed to be surrounded by a cooling pipe 20e as the cooler which is formed into a cylindrical shape as a pipe shape. In this case, the cooling pipe 20e as the cooler can be at least regarded as facing each other at two or more outer positions in the radial direction (in this case, a whole circumference) where the thermal radiation heater 10b is sandwiched by the coolers 20e at the two positions as the heater is at a center. That is, the thermal radiation heater 10b is arranged to be sandwiched (surrounded) by the cooling pipe 20e as the cooler. Therefore, the heated portion of the workpiece, which is heated by the thermal radiation heater 10b, can be cooled by completely surrounding the whole circumference (all-around) with the cooling pipe 20e, and thus it is possible to more efficiently cool the workpiece by distributing the heat of the heated portion of the workpiece into multiple directions (azimuth direction).

In addition, a case where the cooling plates 20a of this embodiment are driven between the standby position and the cooling position by the air cylinder 24 (refer to FIG. 2B) to be moved is described, but in another embodiment, the cooling plates 20a may be formed not to be moved by being fixed to the cooling position. That is, the cooling plate 20a is in a state of being fixed to the cooling position without being retracted into the standby position (the separated position) even while the workpiece is being heated by the thermal radiation heater

10. In this case, the guide pin 26 (refer to FIG. 1B) described above which protrudes across the transport line 110L of the workpiece (refer to FIG. 1B) is not disposed in the cooling plates 20a, and instead, the workpiece can be positioned by using the guide block 60 (refer to FIG. 1B) described above. Thus, after the workpiece is heated by the thermal radiation heater 10, the cooling plates 20a are not moved (driven) to abut on the workpiece, and thus it is possible to shorten a time from the end of the heating of the workpiece to the start of the cooling of the workpiece (a movement time of the cooling plates 20a). Therefore, it is possible to further shorten the cycle time of the soldering.

In addition, in such a case, it is possible to perform the soldering by optionally controlling the heating/cooling of the workpiece. For example, when the soldering is performed in vacuum (or in atmosphere gas of which a pressure is lower than or equal to the atmospheric pressure), a convective flow of the atmosphere gas does not occur, and thermal conductivity (a heat transfer coefficient between the cooling plate 20a and the workpiece) decreases compared to a case where the soldering is performed in atmospheric air, and thus when the temperature of the workpiece excessively increases (overshoots) at the time of performing the heating, it is difficult to control the temperature of the workpiece such that it is a suitable temperature by using the cooling plate 20a. Even in such a case, when the cooling plate 20a is disposed to be fixed to the cooling position, the cooling plate 20a is not moved, and the cooling can be rapidly started, and thus it is possible to realize suitable temperature control (high speed temperature control) of the workpiece. The cooling by the cooling plate 20a is typically started after the workpiece is finished to heat by the thermal radiation heater 10, but for example, when the soldering is performed in vacuum, when a long time is required for cooling the workpiece, or when a cooling time is required to be further shortened, the cooling by the cooling plate 20a may be started before the heating of the workpiece by the thermal radiation heater 10 is finished.

In addition, when the cooling plate 20a is disposed to be fixed to the cooling position, the entire inner surface of the recessed portion (the groove) 21 (of the cooling device 20 (refer to FIG. 1A, 1B)) formed by the plurality of cooling plates 20a may be formed as the mirror surface (the thermal blocking means 22), and the thermal radiation heater 10 may be formed to be embedded in the recessed portion 21. In this case, the entire thermal radiation by the thermal radiation heater 10 disposed to be embedded in the recessed portion 21 can be reflected by the mirror surface (the thermal blocking means 22) inside the recessed portion 21 and can be concentrated on the opening of the recessed portion 21. Therefore, the entire radiation heat radiated from the thermal radiation heater 10 can be intensively radiated onto the portion to be heated (the portion to be heated is in accordance with the position of the solder joint portion) of the workpiece which blocks the opening of the recessed portion 21 by abutting on the cooling plate 20a. Therefore, the thermal radiation heater 10 can efficiently and intensively heat a predetermined portion to be heated (the solder joint portion) of the workpiece. Thus, when the cooling plate 20a is disposed to be fixed to the cooling position, it is possible to more efficiently perform the heating of the workpiece, and thus it is possible to further shorten the cycle time of the soldering.

In addition, in this embodiment, for example, as illustrated in FIG. 2A, 2B, a case where the soldering apparatus 100 includes the airtight chamber 120 is described, but in another embodiment, when the soldering is performed by using the solder into which the flux (the reducing agent) is added, the soldering apparatus may not include the airtight chamber 120.

In addition, in this embodiment, a case where the soldering is performed by substituting the atmosphere in the airtight chamber 120 with the atmosphere of the reducing gas is described, but in another embodiment, the atmosphere in the airtight chamber 120 may be substituted with the atmosphere of the inert gas (for example, nitrogen, argon, or the like) instead of the reducing gas atmosphere, and oxygen is similarly eliminated, and thus the soldering with high reliability can be performed.

In addition, in this embodiment, for example, as illustrated in FIG. 2B, a case where the airtight chamber 120 is exhausted by the vacuum pump 130 and the soldering is performed is described, but in another embodiment, the vacuum pump 130 is not connected to the one supply and exhaust port 121, and for example, in a state where the one supply and exhaust port 121 is opened to the atmospheric air, reducing gas or inert gas may be continuously supplied into the airtight chamber 120 from the other supply and exhaust port 121 by using the gas supply pump 140. In this case, the air in the airtight chamber 120 can be evacuated (purged) by the reducing gas or the inert gas, and thus it is possible to perform the soldering with high reliability by eliminating most of oxygen (air) using a more simple apparatus configuration.

Alternatively, in contrast, the reducing gas or the inert gas is not supplied by using the gas supply pump 140, and in a state where the air in the airtight chamber 120 is exhausted by the vacuum pump 130, the soldering may be performed. In this case, an influence on quality of the soldering due to oxygen is suppressed, and thus it is possible to perform the soldering with high reliability by a simpler apparatus configuration.

In addition, in this embodiment, for example, as illustrated in FIG. 1A, 1B, a case where the thermal radiation heaters 10 and the cooling plates 20a respectively heat and cool the workpiece from a back surface side of the substrate 3 of the workpiece is described, but in another embodiment, insofar as there is no damage on the electronic component 2 due to the heating, the thermal radiation heaters 10 and the cooling plates 20a may be disposed to perform the heating and the cooling from an upper surface side of the electronic component 2 of the workpiece. In this case, the upper surface of the electronic component 2 is heated by the thermal radiation, and the solder joint portion 4 can be rapidly heated by the thermal conduction (the heat transfer) passing through the electronic component 2 with a small thermal capacity and to be soldered, and thus it is possible to efficiently heat and cool the workpiece in a short time.

In addition, in this embodiment, for example, as illustrated in FIG. 1A, 1B, a case where the heating is performed to the workpiece only by the thermal radiation heater 10 is described, but in still another embodiment, for example, a hot air heating heater (not illustrated) for spraying hot air to the workpiece from a direction (the facing direction) opposite to a heating direction by the thermal radiation heater 10 is also disposed in order to assist the heating of the workpiece by the thermal radiation heater 10, and the heating by the thermal radiation heater 10 may be assisted. In this case, it is possible to more quickly heat the workpiece, and in addition, thermal deformation (thermal warpage) of the workpiece is prevented by heating the workpiece from both of the surfaces, and thus it is possible to perform the soldering with high reliability.

In addition, in this embodiment, for example, as illustrated in FIG. 2A, 2B, a case where the soldering apparatus 100 performs the soldering while controlling as required the heating of the workpiece 1 by the thermal radiation heater 10 and the cooling of the workpiece 1 by the cooling plate 20a using the control device 50 based on a measured value of the radiation temperature of the workpiece 1 by the radiation thermometer 40 is described. However, the present invention is not limited thereto. In another embodiment, the soldering apparatus includes the radiation thermometer 40 at the time of a test operation or a set up operation, grasps a suitable heating/cooling method, and records the method in the control device 50. In addition, at the time of an ordinary production operation, the radiation thermometer 40 is detached from the soldering apparatus, and the control device 50 may control the soldering apparatus such that it reproduces the suitable heating/cooling method recorded by the control device 50. In still another embodiment, the soldering apparatus may not include the radiation thermometer 40, and the control device 50 may control the soldering apparatus such that it reproduces the suitable heating/cooling method which is grasped based on a previous production result. For example, the control device 50 may control the soldering apparatus such that it reproduces a suitable heating/cooling time, or a heating/cooling output which is experimentally or statistically grasped.

Figure 5A:
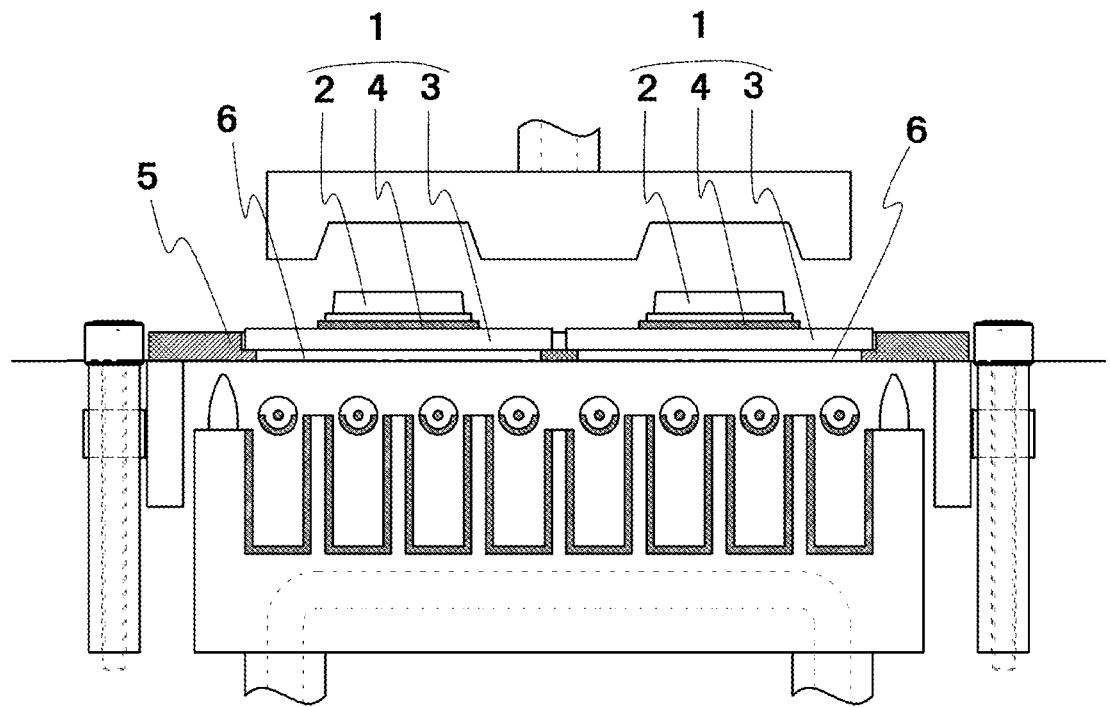
FIG. 5A is a drawing illustrating an example of the heating/cooling treatment unit of the soldering apparatus provided with a carrier plate according to yet another embodiment of the present invention at the time of performing the heating.
Figure 5B:
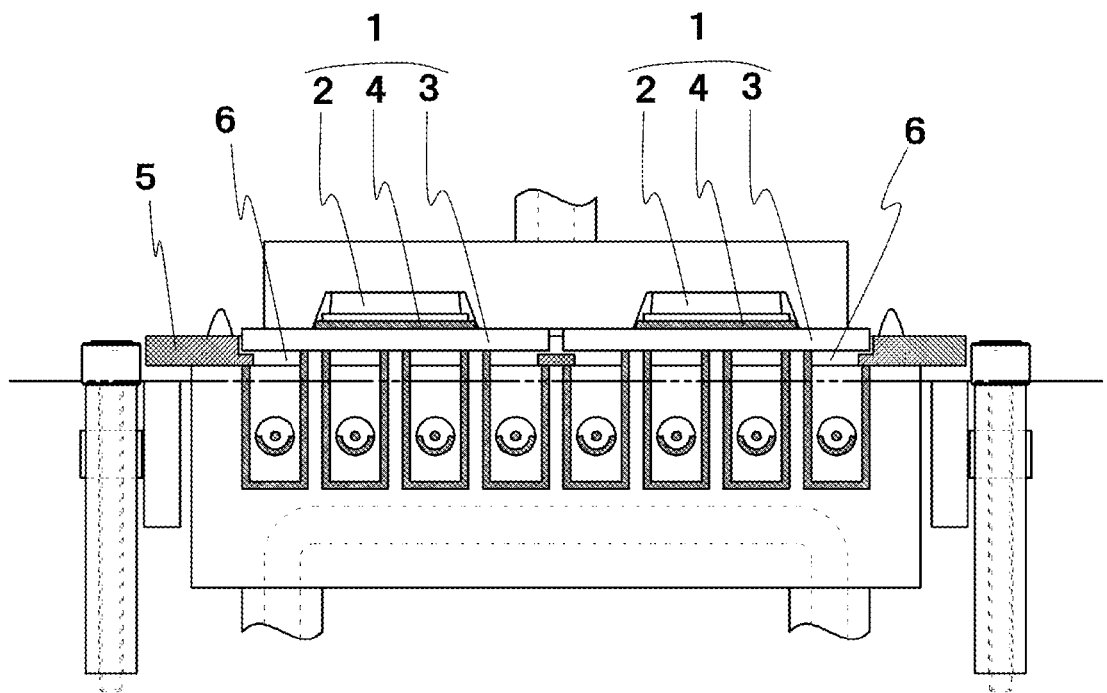
FIG. 5B is a drawing illustrating an example of the heating/cooling treatment unit of the soldering apparatus provided with a carrier plate according to yet another embodiment of the present invention at the time of performing the cooling.

With reference to FIG. 5A, 5B, the soldering apparatus including a carrier plate 5 according to yet another embodiment of the present invention will be described. In yet another embodiment, the soldering apparatus may further include a carrier plate (or a base plate) 5 which transports a plurality of workpieces 1 by placing the workpieces 1 in a row in order to enable a parallel treatment of the soldering. In this case, the plurality of workpieces 1 can be concurrently soldered by being arranged in parallel, and thus it is possible to further improve productivity of the soldering apparatus. That is, when an atmosphere change such as vacuum suction is performed, the effect is especially remarkable, and it is possible to obtain an effect of shortening the cycle time per one workpiece 1 to be soldered compared to a case where a single workpiece 1 is individually soldered. In addition, it is possible to obtain an effect of downsizing the soldering apparatus according to space saving by the parallel treatment of the soldering.

In the carrier plate 5 provided in the soldering apparatus of this embodiment, an opening window (a hole) 6 is formed in a corresponding portion corresponding to the heat treatment portion of the carrier plate 5 such that the thermal radiation heater 10, the cooling plate 20a, and the guide block 60 (respectively refer to FIG. 1A, 1B) can access the solder joint portion 4 of the workpiece 1. Therefore, the heating of the workpiece 1 by the thermal radiation heater 10 and the cooling of the workpiece 1 by the cooling plate 20a are not hindered by the carrier plate 5. Therefore, the soldering apparatus of this embodiment can directly heat and cool the workpiece 1 by the thermal radiation heater 10 and the cooling plate 20a not through the carrier plate 5.

Incidentally, in carrier plate 5, similarly, opening windows (holes) for avoiding interference with other components such as the guide pin 26 (refer to FIG. 1A, 1B) may be formed in addition to the opening window (the hole) 6 corresponding to the heat treatment portion described above. In addition, when a thermal capacity of the carrier plate 5 is sufficiently reduced by forming the carrier plate 5 to be sufficiently thin, by forming the opening window 6 with a sufficient size in the carrier plate 5, or the like, the heating and the cooling may be performed to workpiece 1 in a state where the carrier plate 5 in which the opening window 6 is formed is sandwiched between the thermal radiation heater 10 and the cooling plate 20a (respectively refer to FIG. 1A, 1B) and the workpiece 1. Alternatively, in another embodiment, the carrier plate 5 in which the opening window (the hole) 6 is not formed may be used. In this case, the thermal capacity of the carrier plate 5 may be set to be sufficiently small, that is, a thickness of the carrier plate 5 may be set to a sufficient degree of thickness for rapidly spreading the heat of the thermal radiation heater 10 over the entire workpiece 1 by the thermal conduction and the thermal diffusion.

Figure 6:
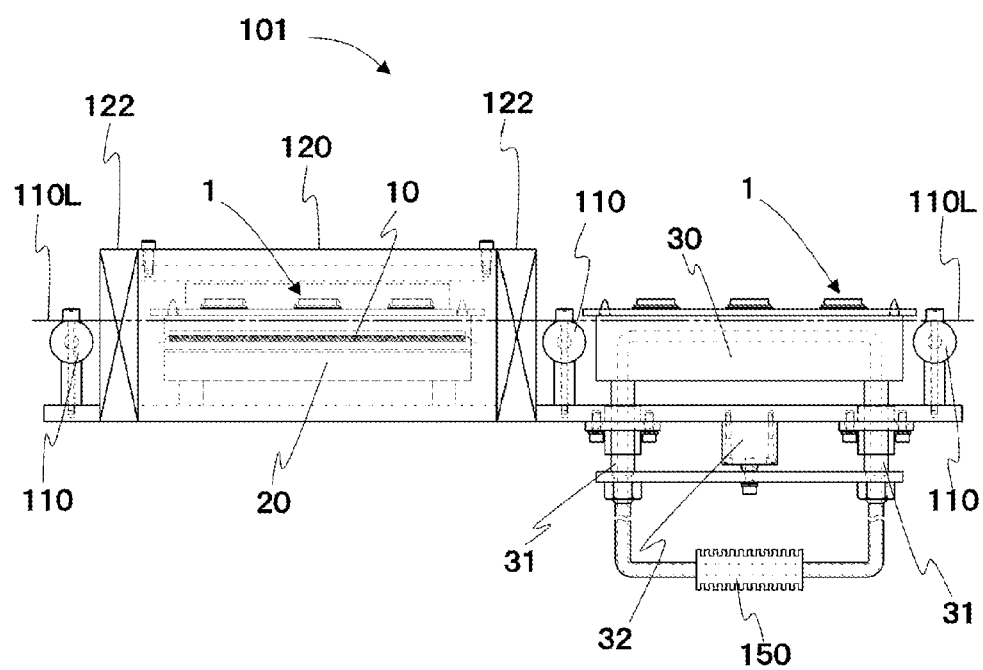
FIG. 6 is a drawing illustrating an example of the soldering apparatus provided with a secondary cooling device according to a second embodiment of the present invention.

With reference to a side arrangement view of FIG. 6, a soldering apparatus 101 including a secondary cooling device 30 according to a second embodiment of the present invention will be described. The cooling of the soldered workpiece 1 may be performed in a primary cooling STEP2B (refer to FIG. 7) of fixing the electronic component on the substrate by cooling the solder joint portion to a temperature lower than or equal to a freezing point of the solder (for example, a temperature lower than or equal to 300 degrees Celsius) using the cooling plate 20a (the cooling device 20), and a secondary cooling STEP2E (refer to FIG. 7) of cooling the solder joint portion to an ordinary temperature (an atmospheric temperature) using the secondary cooling device 30.

In the workpiece 1 subjected to primary cooling, the soldered electronic component is not shifted from the substrate while transporting the workpiece 1. Therefore, the workpiece 1 subjected to the primary cooling STEP2B (refer to FIG. 7) by the cooling plate 20a (the cooling device 20) is transported on the transport line 110L up to the secondary cooling device 30 which is formed to be adjacent to the cooling device 20 sandwiching the gate valve 122 therebetween, and is subjected to the secondary cooling STEP2E (refer to FIG. 7), and thus it is possible to concurrently perform the cooling of the workpiece in two steps of the primary cooling STEP2B and the secondary cooling STEP2E. In this case, the two steps of cooling are performed in parallel, and thus it is possible to further shorten the cycle time (a time/critical path required for cooling the workpiece 1) of the soldering.

As in the soldering apparatus 101 of this embodiment, the primary cooling STEP2B (refer to FIG. 7) may be performed in the airtight chamber 120, and the secondary cooling STEP2E (refer to FIG. 7) may be performed in atmospheric air. In this case, an airtight structure using a sealing member or the like is not necessary, and thus it is possible to more easily form the secondary cooling device 30. Space saving of the soldering apparatus 101 which occurs by compactly forming the secondary cooling device 30 allows a cooling capacity (a cooling thermal capacity) of the secondary cooling device 30 to be improved, and thus it is possible to realize the soldering in a shorter cycle time. Furthermore, in still another embodiment, the secondary cooling device 30 may be formed in the airtight chamber 120. In this case, the vacuum breaking in the airtight chamber 120 (or opening to the atmospheric air) is not performed (that is, the workpiece 1 is not transported by opening the gate valve 122 to pass therethrough), but the workpiece 1 can be transported from the cooling plate 20a (the cooling device 20) to be cooled to the secondary cooling device 30, and thus it is possible to more quickly start the secondary cooling STEP2E.

Figure 7:
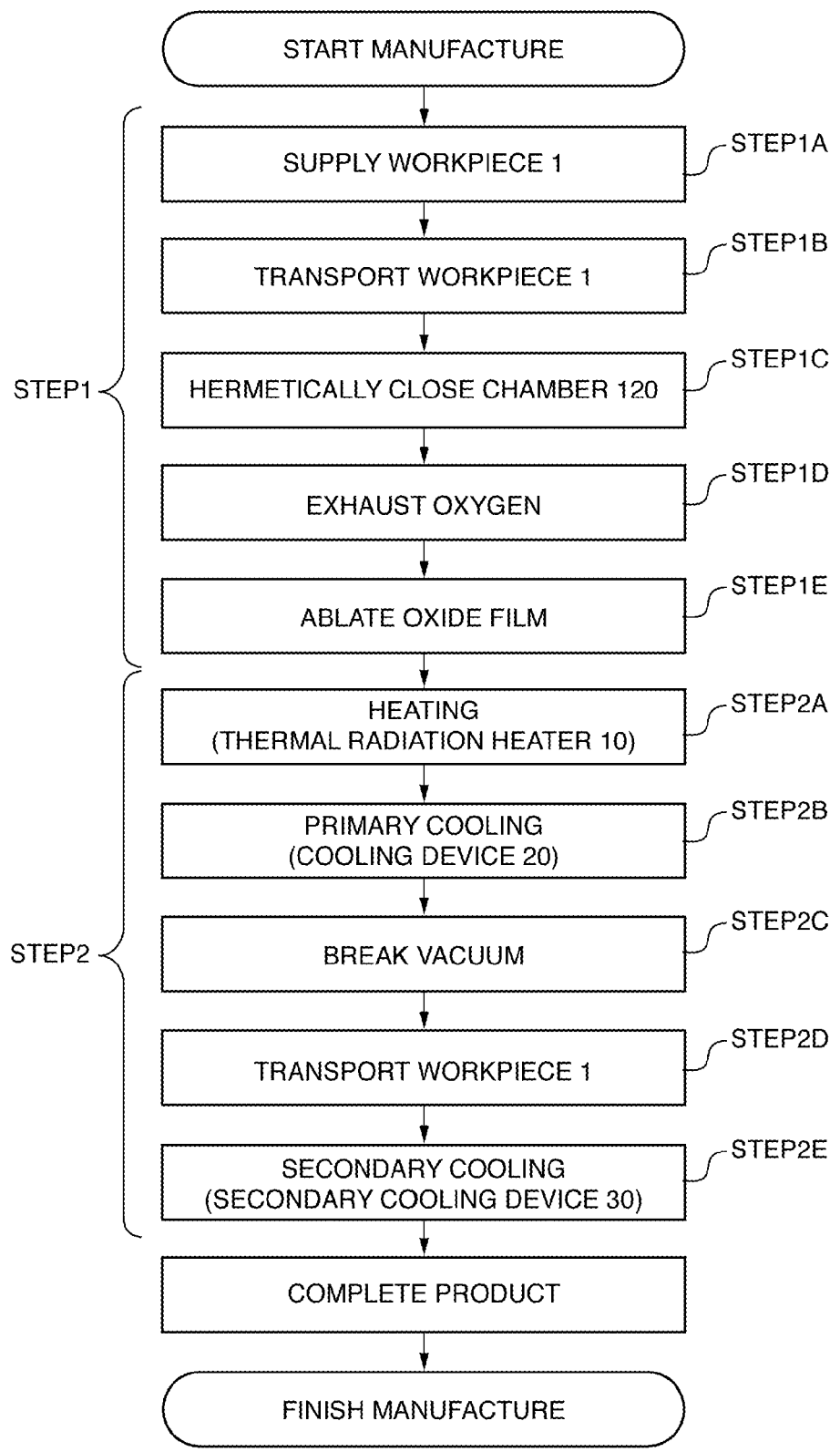
FIG. 7 is a flowchart illustrating a manufacturing method of a soldered product according to a third embodiment of the present invention.

With reference to FIG. 7, a manufacturing method of a soldered product according to a third embodiment of the present invention will be described. The manufacturing method of a soldered product includes a step STEP1 of loading the workpiece 1 to be soldered on the soldering apparatus (for example, the soldering apparatus 100 illustrated in FIG. 2A, 2B), and a step STEP2 of soldering the workpiece 1 by using the soldering apparatus. Here, the step STEP1 of loading the workpiece to be soldered on the soldering apparatus may include a step STEP1A of supplying the workpiece 1 to be soldered to the soldering apparatus, a step STEP1B of transporting the supplied workpiece 1 to the heat treatment position of the soldering apparatus, a step STEP1C of sealing (hermetically closing) the airtight chamber 120, a step STEP1D of exhausting oxygen from the airtight chamber 120, and a step STEP1E of reducing and ablating the oxide film on the solder surface.

In addition, the step STEP2 of soldering the workpiece by using the soldering apparatus (for example, the soldering apparatus 100 illustrated in FIG. 2A, 2B) may include a step STEP2A of heating the workpiece 1 by the thermal radiation heater 10, a step STEP2B of performing the primary cooling of the solder joint portion 4 of the soldered workpiece 1 down to a temperature lower than or equal to a freezing point by the cooling plates 20a (the cooling device 20 (refer to FIG. 6)) which are arranged to sandwich the thermal radiation heater 10 therebetween, a step STEP2C of breaking the vacuum in the airtight chamber 120, a step STEP2D of transporting the workpiece 1 which is subjected to the primary cooling STEP2B to the secondary cooling device 30 (refer to FIG. 6), and a step STEP2E of performing the secondary cooling of the workpiece 1 which has been subjected to the primary cooling STEP2B down to an ordinary temperature (an atmospheric temperature) by the secondary cooling device 30.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising", "having", "including", and "containing" are to be construed as open-ended terms (i.e., meaning "including, but not limited to") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

DESCRIPTION OF REFERENCE NUMERALS AND SYMBOLS 1 workpiece
2 electronic component
3 substrate
3a positioning hole (substrate)
4 solder joint portion
5 carrier plate/base plate
6 opening window (carrier plate)
10 thermal radiation heater
10a thermal radiation heater
10b thermal radiation heater
11 thermal radiation unit (thermal radiation filament)
12 thermal blocking means (mirror surface)
13 thermal radiation unit sealing tube (quartz glass tube)
20 cooling device
20a cooling plate
20b cooling base portion
20c cooling plate
20d cooling gas spray nozzle
20e cooling pipe
21 groove portion (recessed portion)
22 thermal blocking means (mirror surface)
23 guide post (for cooling plate drive)
24 air cylinder (for cooling plate drive)
25 refrigerant flow path
26 guide pin
30 secondary cooling device
31 guide post (for secondary cooling device drive)
32 air cylinder (for secondary cooling device drive)
40 radiation thermometer
50 control device
60 guide block (facing cooler)
61 guide post (for guide block drive)
62 air cylinder (for guide block drive)
100 soldering apparatus
101 soldering apparatus
110 transport roller
110L transport line
120 airtight chamber
121 supply and exhaust port
122 gate valve
123 viewing window
130 vacuum pump
140 gas supply pump
150 refrigerant supply device

What is claimed is:
1. A soldering apparatus, comprising:
a thermal radiation heater configured to heat a workpiece to be soldered by thermal radiation; and
two coolers configured to cool by thermal conduction the workpiece soldered, the coolers being arranged to sandwich the thermal radiation heater therebetween, movable between a standby position and a cooling position, and formed with a recessed portion, the recessed portion configured to dispose therein the thermal radiation heater sandwiched between the two coolers;
wherein the coolers are configured to be moved to the standby position where the coolers are separated from the workpiece and stand by such that the thermal radiation heater is in a state of protruding from the recessed portion, the state of protruding being due to the moving, while the thermal radiation heater heats the workpiece, and the coolers are configured to be moved from the standby position to the cooling position to cool the workpiece in which the coolers are in contact with the workpiece.
2. The soldering apparatus according to claim 1, further comprising:
thermal blocking means for blocking radiation heat from the thermal radiation heater, the thermal blocking means being formed between the thermal radiation heater and the coolers.

3. The soldering apparatus according to claim 1, comprising a plurality of thermal radiation heaters, each of the thermal radiation heaters being sandwiched between the two coolers,
wherein each of the coolers is formed of a cooling plate, the thermal radiation heaters and the coolers are alternately arranged so as to be along a surface to be heated of the workpiece.

4. The soldering apparatus according to claim 1, further comprising:
an airtight chamber configured to airtightly surround the thermal radiation heater and the coolers.

5. The soldering apparatus according to claim 1, further comprising:
a guide post configured to guide a movement of the coolers;
a cooling base portion, the coolers being integrally connected thereto; and
a refrigerant supply device configured to supply a refrigerant to cool the cooler,
wherein a refrigerant flow path is formed inside the cooling base portion and the guide post, the refrigerant flow path being for circulating the refrigerant in the cooling base portion through the guide post to cool the coolers.

6. The soldering apparatus according to claim 1, further comprising:
a radiation thermometer configured to measure a radiation temperature of the workpiece; and
a control device configured to control a heating of the workpiece by the thermal radiation heater and a cooling of the workpiece by the coolers based on the radiation temperature of the workpiece measured by the radiation thermometer.

7. The soldering apparatus according to claim 1, further comprising:
a secondary cooling device configured to further cool the workpiece after a cooling by the coolers.

8. A manufacturing method of a soldered product, comprising:
a step of loading a workpiece to be soldered on the soldering apparatus according to claim 1; and
a step of soldering the workpiece by using the soldering apparatus.

* * * * *